US012588138B2

(12) United States Patent
Chen

(10) Patent No.: US 12,588,138 B2
(45) Date of Patent: Mar. 24, 2026

(54) RADIO FREQUENCY TRANSMISSION CIRCUIT BOARD AND MANUFACTURING METHOD THEREOF

(71) Applicants:QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

(72) Inventor: Kuan-Ying Chen, Jiangsu Province (CN)

(73) Assignees: QingDing Precision Electronics (Huai'an) Co., Ltd., Jiangsu Province (CN); Avary Holding (Shenzhen) Co., Ltd., Shenzhen (CN); Garuda Technology Co., Ltd., New Taipei City (TW)

( * ) Notice: Subject to any disclaimer, the term of this patent is extended or adjusted under 35 U.S.C. 154(b) by 206 days.

(21) Appl. No.: 18/618,153

(22) Filed: Mar. 27, 2024

(65) Prior Publication Data

US 2025/0311094 A1     Oct. 2, 2025

(51) Int. Cl.
*H05K 1/02*      (2006.01)
*G02B 6/42*      (2006.01)

(52) U.S. Cl.
CPC ......... *H05K 1/0274* (2013.01); *G02B 6/4206* (2013.01); *G02B 6/4293* (2013.01); *H05K 1/024* (2013.01); *H05K 1/028* (2013.01)

(58) Field of Classification Search
CPC ............................ H05K 1/0274; G02B 6/4206

USPC ........................................................ 174/250
See application file for complete search history.

(56) References Cited

U.S. PATENT DOCUMENTS

| | | | | |
|---|---|---|---|---|
| 8,686,297 | B2* | 4/2014 | Shiu ....................... | H05K 1/028 174/250 |
| 2011/0255250 | A1* | 10/2011 | Dinh ....................... | H05K 3/363 174/250 |
| 2024/0077670 | A1 | 3/2024 | Tseng et al. | |

FOREIGN PATENT DOCUMENTS

| | | |
|---|---|---|
| CN | 114205990 A | 3/2022 |
| CN | 115308850 A | 11/2022 |
| CN | 115407434 A | 11/2022 |
| CN | 116800337 A | 9/2023 |
| TW | 571140 B | 1/2004 |

* cited by examiner

*Primary Examiner* — Andargie M Aychillhum
(74) *Attorney, Agent, or Firm* — MUNCY, GEISSLER, OLDS & LOWE, P.C.

(57)      ABSTRACT

A radio frequency transmission circuit board has a bending portion, a signal transmitting portion and a signal receiving portion, and includes a first multilayer structure, a second multilayer structure, a third multilayer structure, a blind hole, a lens and an optical fiber. The blind hole extends from the second multilayer structure to the first multilayer structure. A reflective layer is arranged in the blind hole. The lens is embedded in the first multilayer structure and partially exposed in the blind hole. The optical fiber is embedded in the first multilayer structure and connected to the lens. The bending portion does not include the second multilayer structure and the third multilayer structure. The blind hole and the lens are located in the signal transmitting portion. The optical fiber is located in the bending portion.

19 Claims, 7 Drawing Sheets

100

200

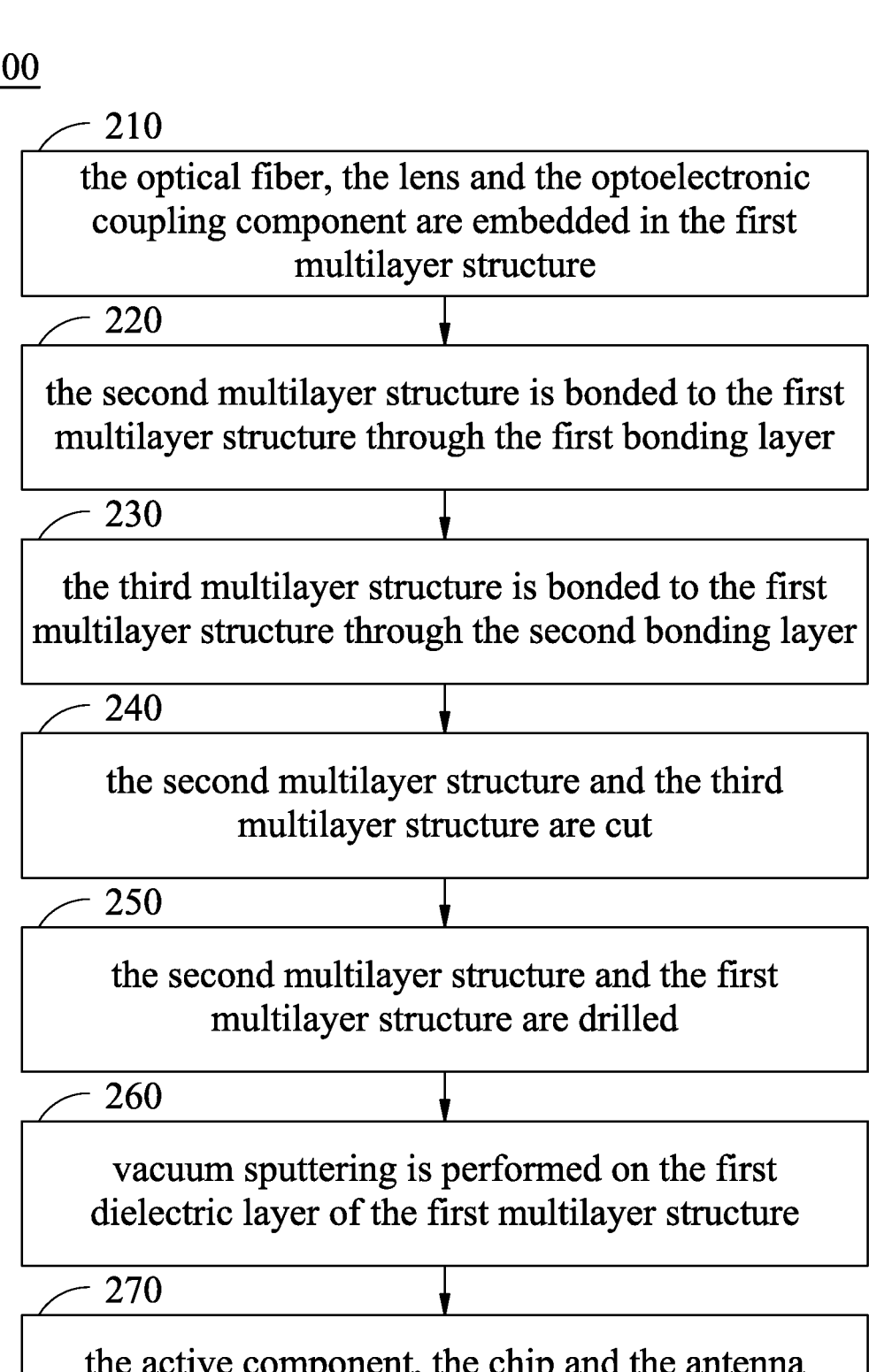

210 the optical fiber, the lens and the optoelectronic coupling component are embedded in the first multilayer structure

220 the second multilayer structure is bonded to the first multilayer structure through the first bonding layer

230 the third multilayer structure is bonded to the first multilayer structure through the second bonding layer

240 the second multilayer structure and the third multilayer structure are cut

250 the second multilayer structure and the first multilayer structure are drilled

260 vacuum sputtering is performed on the first dielectric layer of the first multilayer structure

270 the active component, the chip and the antenna component are disposed

Fig. 2

$110 \begin{cases} 112 \\ 111 \\ 112 \end{cases}$

H          H $110 \begin{cases} 112 \\ 111 \\ 112 \end{cases}$

H

RADIO FREQUENCY TRANSMISSION CIRCUIT BOARD AND MANUFACTURING METHOD THEREOF

BACKGROUND

Technical Field

The present disclosure relates to a circuit board and a manufacturing method thereof. More particularly, the present disclosure relates to a radio frequency transmission circuit board which has the properties of light-weight, low transmission loss and bendability and a manufacturing method thereof.

Description of Related Art

The development of the sixth-generation mobile communication technology (6G) mainly focuses on the fusion of digital and physical interaction, the integration of artificial intelligence and communication systems and the communication capabilities presented everywhere. With the expansion of 6G application scenarios, the keys of 6G development include high-speed and stable connections, wide and massive communication, efficient resource utilization and enhancing user experience. Therefore, the development of high-frequency optical radio communication devices becomes increasingly important.

However, in the conventional communication device, signal transmission between the circuit board and the electronic components is mostly done through metal wires. In the high-frequency transmission technology, as the frequency band gradually increases, the requirements of high transmission efficiency and low loss are difficult to be met. In detail, compared with optical communication, using metal wires for transmission will result in higher transmission loss, and it is not favorable for high-frequency and high-speed transmission. Furthermore, the conventional optical communication device can include optical transceiver modules and use optical fiber transmission lines for signal transmission. However, the optical fiber transmission lines are disposed outside the circuit board, so the lightweight of the optical communication device cannot be achieved. In the conventional optical communication device, the embedded mirror is used as a light reflection device in light transmission, so that it also limits the thickness of the circuit board to the size of the embedded mirror, and has the risks of heterogeneous interface separation. Moreover, the circuit board of the conventional optical communication device lacks bendability, so the maximized utilization of space in the end products is limited.

SUMMARY

According to the present disclosure, a radio frequency transmission circuit board has a bending portion, a signal transmitting portion and a signal receiving portion. The bending portion is respectively connected to and is located between the signal transmitting portion and the signal receiving portion. The radio frequency transmission circuit board includes a first multilayer structure, a second multilayer structure, a third multilayer structure, a first bonding layer, a second bonding layer, a blind hole, a lens, an active component, a chip, an optical fiber, an optoelectronic coupling component and an antenna component. The first multilayer structure includes a first dielectric layer and two first metal layers. The first dielectric layer is respectively connected to nected to and is located between the two first metal layers. The second multilayer structure includes a second dielectric layer and a second metal layer. The second metal layer is arranged on the second dielectric layer. The third multilayer structure includes a third dielectric layer and a third metal layer. The third metal layer is arranged on the third dielectric layer. The first bonding layer is arranged between the first multilayer structure and the second multilayer structure, and is bonding one of the two first metal layers to the second dielectric layer. The second bonding layer is arranged between the first multilayer structure and the third multilayer structure, and is bonding the other of the two first metal layers to the third dielectric layer. The blind hole extends from the second metal layer to the first dielectric layer. A reflective layer is arranged at a bottom end of the blind hole. The lens is embedded in the first multilayer structure, and the lens is partially exposed in the blind hole. The active component is electrically connected to the second metal layer and aligned with the blind hole. The chip is electrically connected to the second metal layer. The optical fiber is embedded in the first multilayer structure. The optical fiber has a first end and a second end opposite to the first end. The first end is connected to the lens. The optoelectronic coupling component is embedded in the first multilayer structure and is connected to the second end of the optical fiber. The optoelectronic coupling component is electrically connected to the one of the two first metal layers. The antenna component is electrically connected to the one of the two first metal layers. The bending portion does not include the second multilayer structure and the third multilayer structure. The blind hole, the lens, the active component and the chip are located in the signal transmitting portion. The optical fiber is located in the bending portion. The optoelectronic coupling component and the antenna component are located in the signal receiving portion.

According to the present disclosure, a manufacturing method of a radio frequency transmission circuit board includes the steps as follows. An optical fiber, a lens and an optoelectronic coupling component are embedded in a first multilayer structure. The optical fiber has a first end and a second end opposite to the first end. The first end is connected to the lens. The second end is connected to the optoelectronic coupling component. The optoelectronic coupling component is electrically connected to one of two first metal layers of the first multilayer structure. A second multilayer structure is bonded to the first multilayer structure through a first bonding layer. The first bonding layer is bonding the one of the two first metal layers to a second dielectric layer of the second multilayer structure. A third multilayer structure is bonded to the first multilayer structure through a second bonding layer. The second bonding layer is bonding the other of the two first metal layers to a third dielectric layer of the third multilayer structure. The second multilayer structure and the third multilayer structure are cut so as to make a portion of the first multilayer structure embedded with the optical fiber not to be covered by the second multilayer structure and the third multilayer structure. The second multilayer structure and the first multilayer structure are drilled to form a blind hole. The blind hole extends from a second metal layer of the second multilayer structure to a first dielectric layer of the first multilayer structure. The second metal layer is arranged on the second dielectric layer, and the first dielectric layer is respectively connected to and is located between the two first metal layers. Vacuum sputtering is performed on the first dielectric layer so as to form a reflective layer at a bottom end of the blind hole. An active component, a chip and an antenna component are disposed. The active component is electrically connected to the second metal layer and aligned with the blind hole, the chip is electrically connected to the second metal layer, and the antenna component is electrically connected to the one of the two first metal layers.

BRIEF DESCRIPTION OF THE DRAWINGS

The present disclosure can be more fully understood by reading the following detailed description of the embodiment, with reference made to the accompanying drawings as follows:

FIG. 2 is a step flow chart of a manufacturing method of a radio frequency transmission circuit board according to another embodiment of the present disclosure.

DETAILED DESCRIPTION

Figure 1:
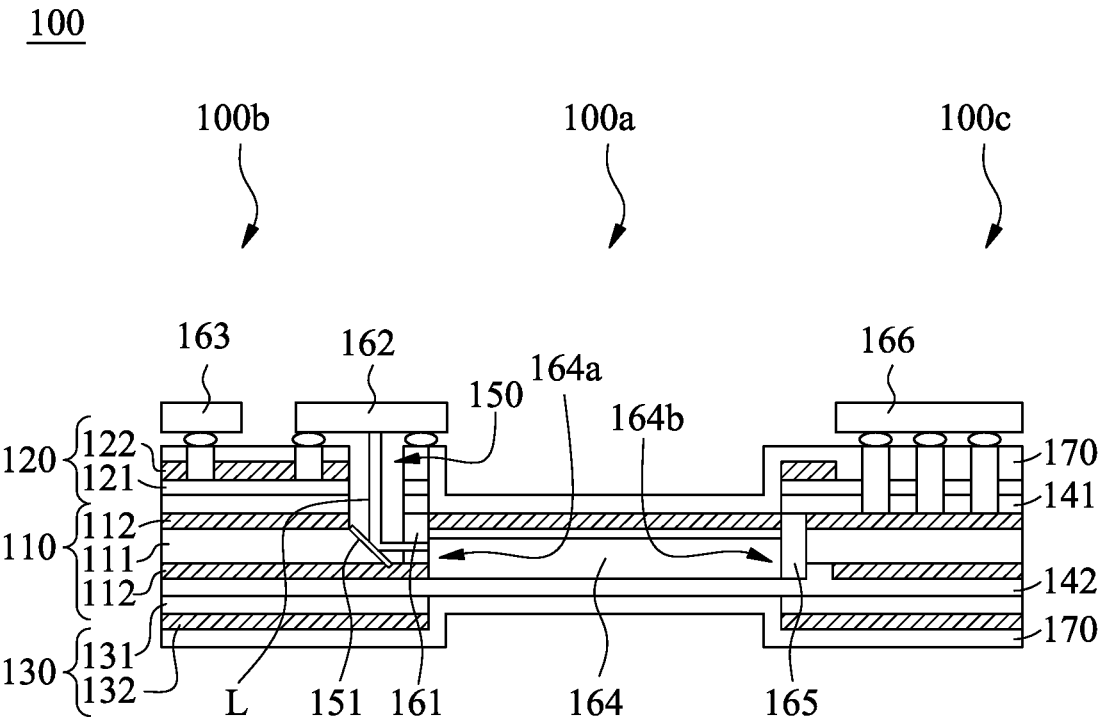
FIG. 1 is a cross-sectional schematic view of a radio frequency transmission circuit board according to an embodiment of the present disclosure.

Reference is made to FIG. 1. FIG. 1 is a cross-sectional schematic view of a radio frequency transmission circuit board 100 according to an embodiment of the present disclosure. The radio frequency transmission circuit board 100 has a bending portion 100a, a signal transmitting portion 100b and a signal receiving portion 100c. The bending portion 100a is respectively connected to and is located between the signal transmitting portion 100b and the signal receiving portion 100c. The radio frequency transmission circuit board 100 includes a first multilayer structure 110, a second multilayer structure 120, a third multilayer structure 130, a first bonding layer 141, a second bonding layer 142, a blind hole 150, a lens 161, an active component 162, a chip 163, an optical fiber 164, an optoelectronic coupling component 165 and an antenna component 166.

In detail, the first multilayer structure 110 includes a first dielectric layer 111 and two first metal layers 112. The first dielectric layer 111 is respectively connected to and is located between the two first metal layers 112. The second multilayer structure 120 includes a second dielectric layer 121 and a second metal layer 122. The second metal layer 122 is arranged on the second dielectric layer 121. The third multilayer structure 130 includes a third dielectric layer 131 and a third metal layer 132. The third metal layer 132 is arranged on the third dielectric layer 131. The two first metal layers 112, the second metal layer 122 and the third metal layer 132 can have patterned circuit. The first dielectric layer 111, the second dielectric layer 121 and the third dielectric layer 131 can include a plurality of through holes for other components to perform circuit connections.

Materials of the first dielectric layer 111, the second dielectric layer 121 and the third dielectric layer 131 can have low dielectric constants and can include at least one of modified polyimide (MPI), liquid crystal polymer (LCP) and polytetraethylene (PTFE). However, the present disclosure is not limited to the aforementioned materials.

The first bonding layer 141 is arranged between the first multilayer structure 110 and the second multilayer structure 120, and is bonding one of the two first metal layers 112 to the second dielectric layer 121. The second bonding layer 142 is arranged between the first multilayer structure 110 and the third multilayer structure 130, and is bonding the other of the two first metal layers 112 to the third dielectric layer 131. Therefore, the first multilayer structure 110, the second multilayer structure 120 and the third multilayer structure 130 can be fixed.

The blind hole 150 extends from the second metal layer 122 to the first dielectric layer 111. A reflective layer 151 is arranged at a bottom end (reference number is omitted) of the blind hole 150. That is, the reflective layer 151 can be formed on the first dielectric layer 111, and the reflective layer 151 is configured for reflecting a light ray L emitted by other components. The reflective layer 151 can be formed by vacuum sputtering to reduce the volume and thickness of the reflective layer 151, and it is favorable for reaching the light-weight of the radio frequency transmission circuit board 100. Moreover, a material of the reflective layer 151 can include at least one of gold, silver, titanium and chromium so as to enhance the reflectivity of the reflective layer 151, and reduce the transmission loss of the light ray L.

The lens 161 is embedded in the first multilayer structure 110, and the lens 161 is partially exposed in the blind hole 150. The position of the lens 161 can be adjusted according to the path of the light ray L reflected by the reflective layer 151. That is, the lens 161 is on the path of the light ray L reflected by the reflective layer 151 for the light ray L to pass. For example, as shown in FIG. 1, the angle between the reflective layer 151 and the horizontal plane is approximately 45 degrees in the present embodiment, and a reflective surface (reference number is omitted) of the reflective layer 151 is facing the lens 161. Hence, the light ray L entering the reflective layer 151 undergoes a 90-degree reflection and enters the lens 161. However, the present disclosure is not limited to the aforementioned arrangement of the reflective layer 151 and the lens 161.

The active component 162 is electrically connected to the second metal layer 122 and aligned with the blind hole 150. The chip 163 is electrically connected to the second metal layer 122. Therefore, the chip 163 and the active component 162 can be electrically connected through the second metal layer 122. The chip 163 is able to control the active component 162 to emit the light ray L into the blind hole 150. Furthermore, a distance between the active component 162 and the chip 163 can be 2 mm to 10 mm. The aforementioned distance is a straight-line distance between an outer edge of the active component 162 and an outer edge of the chip 163. Through adjusting the aforementioned distance, the electronic signal interference between the active component 162 and the chip 163 can be reduced.

The optical fiber 164 is embedded in the first multilayer structure 110. The optical fiber 164 has a first end 164a and a second end 164b opposite to the first end 164a. The first end 164a is connected to the lens 161. Therefore, the reflected light ray L can pass through the lens 161 and enter the optical fiber 164 for transmission. Because the transmission loss of the transmission by the optical fiber 164 is lower than electrical transmission, and it is more favorable for satisfying the requirements of high-frequency and high-speed transmission.

The optoelectronic coupling component 165 is embedded in the first multilayer structure 110 and is connected to the second end 164b of the optical fiber 164. The optoelectronic coupling component 165 is electrically connected to the one of the two first metal layers 112, and the antenna component 166 is electrically connected to the one of the two first metal layers 112. Therefore, the optoelectronic coupling component 165 and the antenna component 166 can be electrically connected through the one of the two first metal layers 112. The optoelectronic coupling component 165 is able to receive the light ray L from the optical fiber 164, and convert the light ray L into electrical signals which is sent to the antenna component 166 so as to drive the antenna component 166.

It should be noted that, the bending portion 100a does not include the second multilayer structure 120 and the third multilayer structure 130. The blind hole 150, the lens 161, the active component 162 and the chip 163 are located in the signal transmitting portion 100b. The optical fiber 164 is located in the bending portion 100a. The optoelectronic coupling component 165 and the antenna component 166 are located in the signal receiving portion 100c. Through the aforementioned arrangement, the thickness of the bending portion 100a is thinner than the signal transmitting portion 100b and the signal receiving portion 100c, and it is favorable for bending and making the radio frequency transmission circuit board 100 adaptable to different spaces.

Furthermore, the bending portion 100a can be without the first bonding layer 141, or the bending portion 100a can include air gaps (not shown). The optical fiber 164 is not limited to strip line structure or microstrip line structure, and the optical fiber 164 can optionally be surrounded by low dielectric materials. Therefore, the structure of the radio frequency transmission circuit board 100 can be adjusted based on the requirements, and it is favorable for bending applications.

The radio frequency transmission circuit board 100 can further include two covering films 170. One of the two covering films 170 can cover the one of the two first metal layers 112 and the second metal layer 122. The other of the two covering films 170 can cover the second bonding layer 142 and the third metal layer 132. Therefore, the two covering films 170 can protect the first multilayer structure 110, the second multilayer structure 120, the third multilayer structure 130 and the components therein.

Reference is made to FIG. 2. FIG. 2 is a step flow chart of a manufacturing method of a radio frequency transmission circuit board 200 according to another embodiment of the present disclosure. The manufacturing method of the radio frequency transmission circuit board 200 includes Step 210, Step 220, Step 230, Step 240, Step 250, Step 260 and Step 270.

Reference is also made to FIG. 3A, FIG. 3B, FIG. 3C, FIG. 3D, FIG. 3E, FIG. 3F, FIG. 3G, FIG. 3H, FIG. 3I and FIG. 3J. FIG. 3A to FIG. 3J are cross-sectional schematic views of each step of the manufacturing method of the radio frequency transmission circuit board 200. In Step 210, the optical fiber 164, the lens 161 and the optoelectronic coupling component 165 are embedded in the first multilayer structure 110. The optical fiber 164 has the first end 164a and the second end 164b opposite to the first end 164a. The first end 164a is connected to the lens 161. The second end 164b is connected to the optoelectronic coupling component 165, and the optoelectronic coupling component 165 is electrically connected to the one of the two first metal layers 112 of the first multilayer structure 110.

Figure 3A:
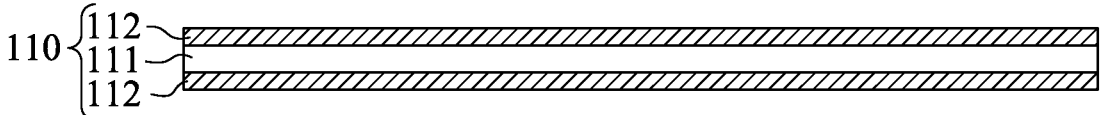
FIG. 3A, FIG. 3B, FIG. 3C, FIG. 3D, FIG. 3E, FIG. 3F, FIG. 3G, FIG. 3H, FIG. 3I and FIG. 3J are cross-sectional schematic views of each step of the manufacturing method of the radio frequency transmission circuit board.
Figure 3B:
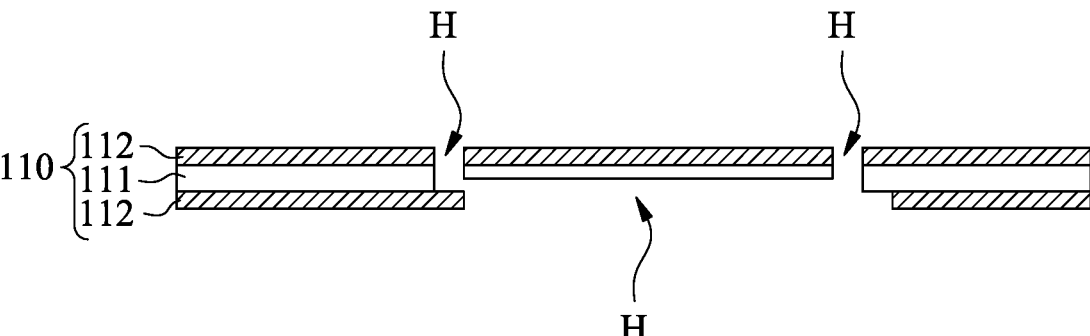
Figure 3C:
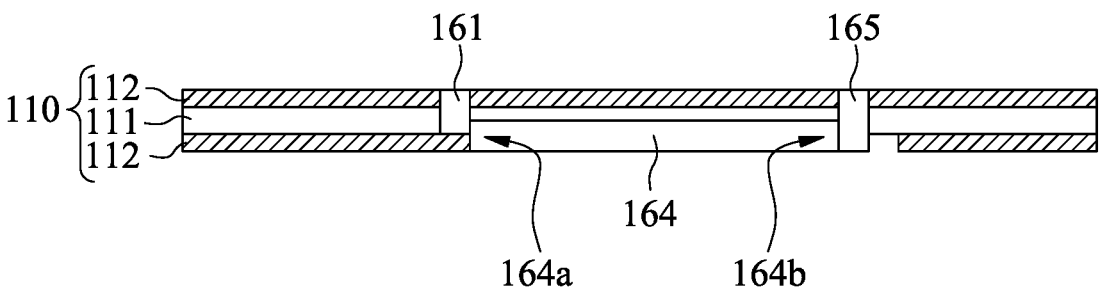
Figure 3D:
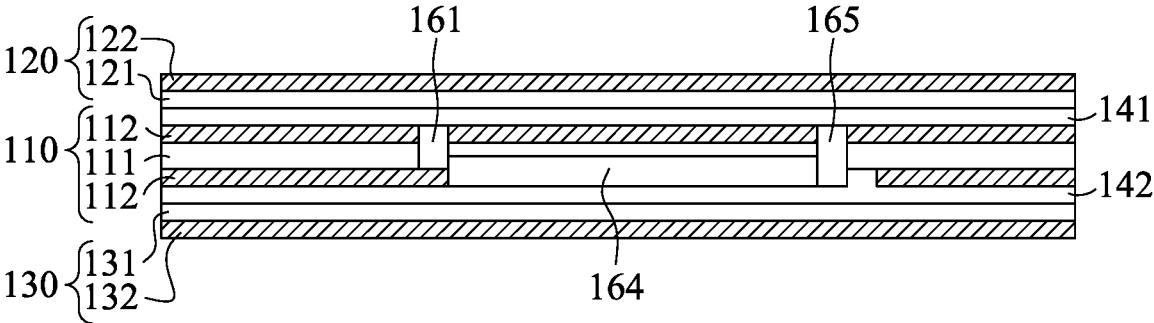

In detail, as shown in FIG. 3A and FIG. 3B, the first multilayer structure 110 can be cut first to form a plurality of embedded holes H on the first multilayer structure 110. Then, the optical fiber 164, the lens 161 and the optoelectronic coupling component 165 are disposed into the plurality of embedded holes H so as to form the structure shown in FIG. 3C.

In Step 220, the second multilayer structure 120 is bonded to the first multilayer structure 110 through the first bonding layer 141. The first bonding layer 141 is bonding the one of the two first metal layers 112 to the second dielectric layer 121 of the second multilayer structure 120. In Step 230, the third multilayer structure 130 is bonded to the first multilayer structure 110 through the second bonding layer 142. The second bonding layer 142 is bonding the other of the two first metal layers 112 to the third dielectric layer 131 of the third multilayer structure 130. Therefore, the multilayer structure shown in FIG. 3D can be formed. It should be noted that, although it is illustrated by bonding the second multilayer structure 120 and then bonding the third multilayer structure 130 in the step flow chart of FIG. 2, but the bonding order of the second multilayer structure 120 and the third multilayer structure 130 does not affect the following processes and structure in actual manufacturing process. Therefore, the present disclosure is not limited to the aforementioned bonding order.

In Step 240, the second multilayer structure 120 and the third multilayer structure 130 are cut so as to make the portion of the first multilayer structure 110 embedded with the optical fiber 164 not to be covered by the second multilayer structure 120 and the third multilayer structure 130. Therefore, the thickness of the portion embedded with the optical fiber 164 can be reduced, and it is favorable for bending the radio frequency transmission circuit board 100.

In Step 250, the second multilayer structure 120 and the first multilayer structure 110 are drilled to form the blind hole 150. The blind hole 150 extends from the second metal layer 122 of the second multilayer structure 120 to the first dielectric layer 111 of the first multilayer structure 110. The second metal layer 122 is arranged on the second dielectric layer 121, and the first dielectric layer 111 is respectively connected to and is located between the two first metal layers 112.

It should be noted that, before the second multilayer structure 120 and the first multilayer structure 110 are drilled, the one of the two first metal layers 112 and the second metal layer 122 can be sequentially covered by a covering film 170 and a sputtering protection film P so as to protect the first multilayer structure 110, the second multilayer structure 120, the third multilayer structure 130 and the components therein.

Figure 3E:
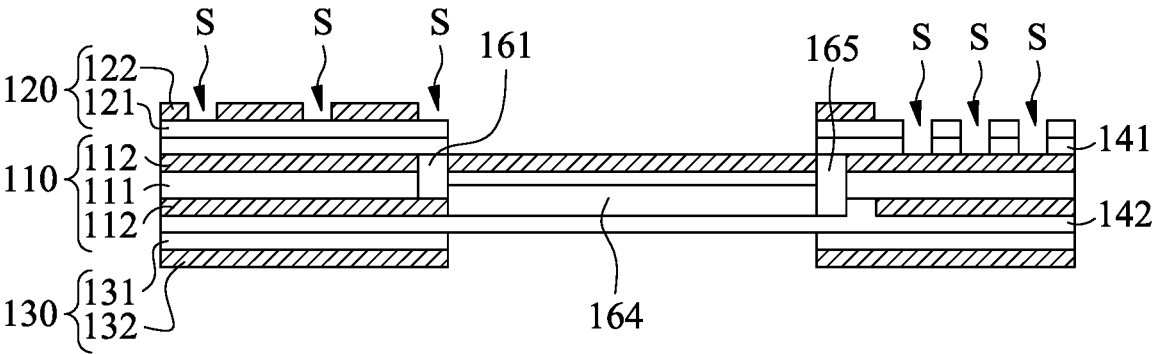
Figure 3F:
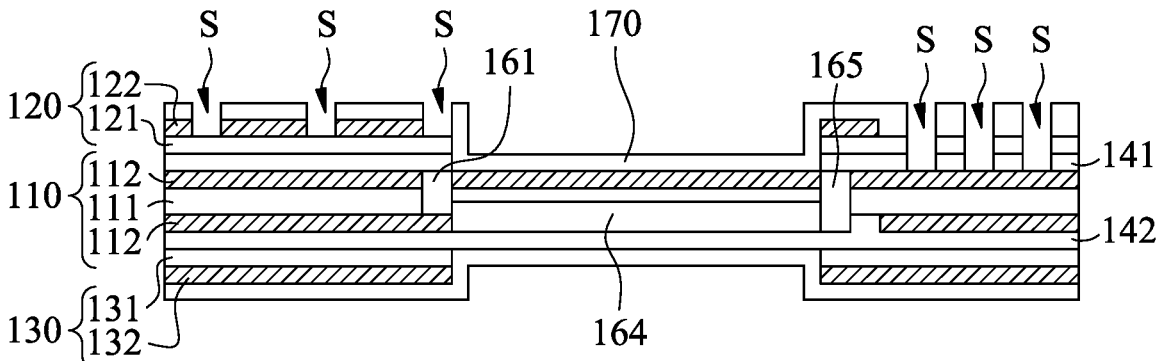
Figure 3G:
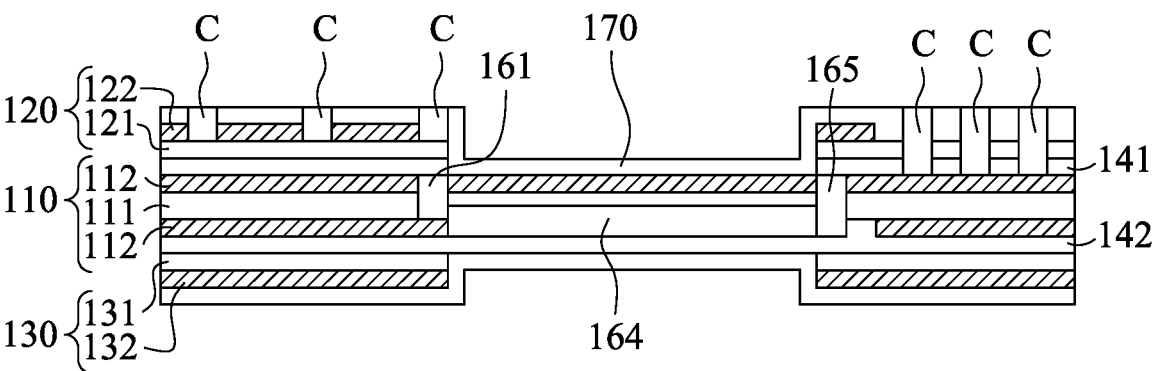

In detail, before drilling, as shown in FIG. 3E, a plurality of conductive through holes S are formed on the second multilayer structure 120. Then, as shown in FIG. 3F, the covering film 170 is disposed. Next, as shown in FIG. 3G, electroplating is performed in the plurality of conductive through holes S to form a plurality of conductive pillars C. Then, the covering film 170 and the plurality of conductive pillars C are covered by the sputtering protection film P, and the structure shown in FIG. 3H can be obtained after drilling.

Figure 3H:
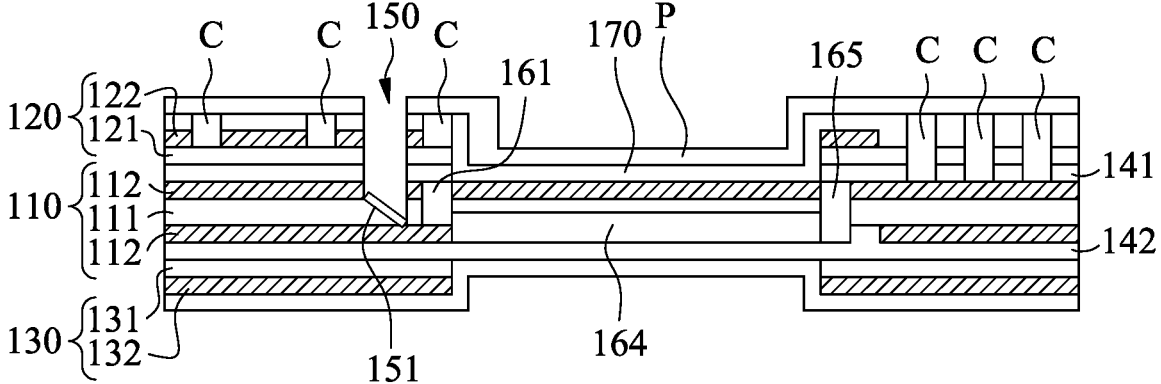

Reference is made to FIG. 3H. In Step 260, vacuum sputtering is performed on the first dielectric layer 111 of the first multilayer structure 110 so as to form the reflective layer 151 at the bottom end (reference number is omitted) of the blind hole 150. For example, the pressure can be $8.0 \times 10^{-3}$ Pa to $8.2 \times 10^{-3}$ Pa, the current can be 100 mA to 130 mA, and the sputtering time can be 180 seconds to 240 seconds during vacuum sputtering. Vacuum sputtering can be performed in an argon gas environment. The conditions of vacuum sputtering can be adjusted according to the requirements, and the present disclosure is not limited to the aforementioned conditions.

Furthermore, the material of the reflective layer 151 can include at least one of gold, silver, titanium and chromium. The structure and material properties of the reflective layer 151 have been described in the foregoing paragraphs, and the details will not be given herein again.

Figure 3I:
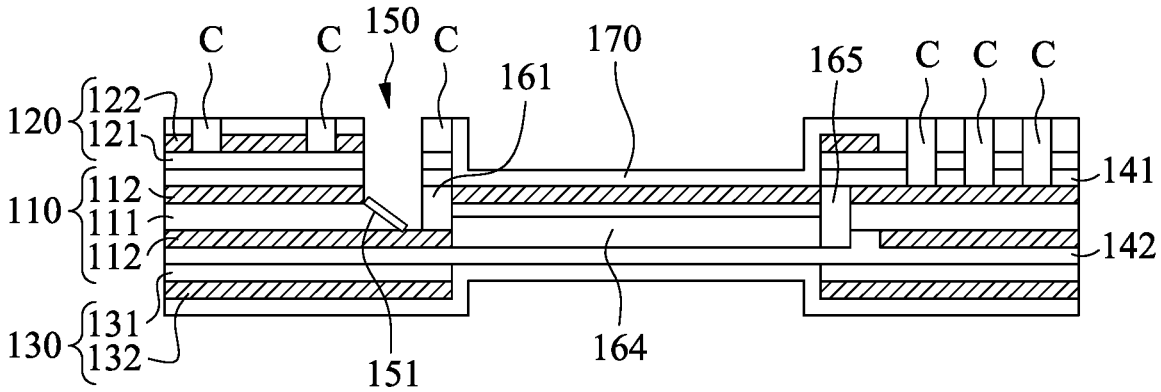

Moreover, as shown in FIG. 3I, after performing vacuum sputtering on the first dielectric layer 111, the blind hole 150 can be further enlarged to make the lens 161 be partially exposed in the blind hole 150. In other words, when the second multilayer structure 120 and the first multilayer structure 110 are being drilled, a portion of the first multilayer structure 110 can be preserved to cover the lens 161 so as to protect the lens 161 and prevent the sputtering material deposited on the surface of the lens 161 and affecting the transmittance of the lens 161 during vacuum sputtering.

Figure 3J:
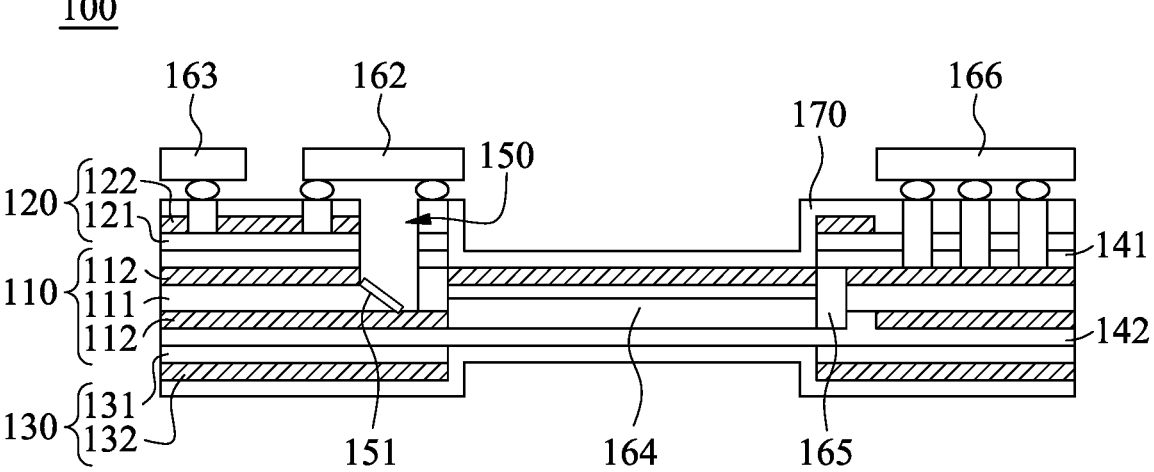

Reference is made to FIG. 3J. In Step 270, the active component 162, the chip 163 and the antenna component 166 are disposed. The active component 162 is electrically connected to the second metal layer 122 and aligned with the blind hole 150, the chip 163 is electrically connected to the second metal layer 122, and the antenna component 166 is electrically connected to the one of the two first metal layers 112 so as to form the radio frequency transmission circuit board 100.

In summary, the radio frequency transmission circuit board of the present disclosure uses the optical fiber as the signal transmission component, so the transmission loss during the transmission process can be reduced, and it is favorable for satisfying the requirements of high-frequency and high-speed transmission. Furthermore, in the radio frequency transmission circuit board of the present disclosure, the volume and thickness of the radio frequency transmission circuit board are reduced by adjusting the thickness of the bending portion, the signal transmitting portion and the signal receiving portion, and by forming the reflective layer using vacuum sputtering. It is favorable for light-weight and bendability, so the radio frequency transmission circuit board can be adaptable to different spaces, and the application flexibility thereof can be enhanced.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A radio frequency transmission circuit board, having a bending portion, a signal transmitting portion and a signal receiving portion, wherein the bending portion is respectively connected to and is located between the signal transmitting portion and the signal receiving portion, and the radio frequency transmission circuit board comprises:
   a first multilayer structure, comprising:
      a first dielectric layer; and
      two first metal layers, wherein the first dielectric layer is respectively connected to and is located between the two first metal layers;
   a second multilayer structure, comprising:
      a second dielectric layer; and
      a second metal layer arranged on the second dielectric layer;
   a third multilayer structure, comprising:
      a third dielectric layer; and
      a third metal layer arranged on the third dielectric layer;

a first bonding layer arranged between the first multilayer structure and the second multilayer structure, and bonding one of the two first metal layers to the second dielectric layer;
   a second bonding layer arranged between the first multilayer structure and the third multilayer structure, and bonding the other of the two first metal layers to the third dielectric layer;
   a blind hole extends from the second metal layer to the first dielectric layer, wherein a reflective layer is arranged at a bottom end of the blind hole;
   a lens embedded in the first multilayer structure, wherein the lens is partially exposed in the blind hole;
   an active component electrically connected to the second metal layer and aligned with the blind hole;
   a chip electrically connected to the second metal layer;
   an optical fiber embedded in the first multilayer structure, wherein the optical fiber has a first end and a second end opposite to the first end, and the first end is connected to the lens;
   an optoelectronic coupling component embedded in the first multilayer structure and connected to the second end of the optical fiber, wherein the optoelectronic coupling component is electrically connected to the one of the two first metal layers; and
   an antenna component electrically connected to the one of the two first metal layers;
   wherein the bending portion does not comprise the second multilayer structure and the third multilayer structure;
   wherein the blind hole, the lens, the active component and the chip are located in the signal transmitting portion, the optical fiber is located in the bending portion, and the optoelectronic coupling component and the antenna component are located in the signal receiving portion.

2. The radio frequency transmission circuit board of claim 1, wherein the bending portion is without the first bonding layer.

3. The radio frequency transmission circuit board of claim 2, further comprising two covering films, wherein one of the two covering films covers the one of the two first metal layers and the second metal layer, and the other of the two covering films covers the second bonding layer and the third metal layer.

4. The radio frequency transmission circuit board of claim 1, wherein a material of the reflective layer comprises at least one of gold, silver, titanium and chromium.

5. The radio frequency transmission circuit board of claim 1, wherein a distance between the active component and the chip is 2 mm to 10 mm.

6. The radio frequency transmission circuit board of claim 1, wherein each of materials of the first dielectric layer, the second dielectric layer and the third dielectric layer comprises at least one of modified polyimide, liquid crystal polymer and polytetraethylene.

7. A manufacturing method of a radio frequency transmission circuit board, comprising:
   embedding an optical fiber, a lens and an optoelectronic coupling component in a first multilayer structure, wherein the optical fiber has a first end and a second end opposite to the first end, the first end is connected to the lens, the second end is connected to the optoelectronic coupling component, and the optoelectronic coupling component is electrically connected to one of two first metal layers of the first multilayer structure;
   bonding a second multilayer structure to the first multilayer structure through a first bonding layer, wherein the first bonding layer is bonding the one of the two first metal layers to a second dielectric layer of the second multilayer structure;

bonding a third multilayer structure to the first multilayer structure through a second bonding layer, wherein the second bonding layer is bonding the other of the two first metal layers to a third dielectric layer of the third multilayer structure;

cutting the second multilayer structure and the third multilayer structure so as to make a portion of the first multilayer structure embedded with the optical fiber not to be covered by the second multilayer structure and the third multilayer structure;

drilling the second multilayer structure and the first multilayer structure to form a blind hole, and the blind hole extending from a second metal layer of the second multilayer structure to a first dielectric layer of the first multilayer structure, wherein the second metal layer is arranged on the second dielectric layer, and the first dielectric layer is respectively connected to and is located between the two first metal layers;

performing vacuum sputtering on the first dielectric layer so as to form a reflective layer at a bottom end of the blind hole; and disposing an active component, a chip and an antenna component, wherein the active component is electrically connected to the second metal layer and aligned with the blind hole, the chip is electrically connected to the second metal layer, and the antenna component is electrically connected to the one of the two first metal layers.

8. The manufacturing method of the radio frequency transmission circuit board of claim 7, wherein embedding the optical fiber, the lens and the optoelectronic coupling component in the first multilayer structure is to cut the first multilayer structure first to form a plurality of embedded holes on the first multilayer structure, and the optical fiber, the lens and the optoelectronic coupling component are disposed into the plurality of embedded holes.

9. The manufacturing method of the radio frequency transmission circuit board of claim 7, wherein before the second multilayer structure and the first multilayer structure are drilled, the one of the two first metal layers and the second metal layer are sequentially covered by a covering film and a sputtering protection film.

10. The manufacturing method of the radio frequency transmission circuit board of claim 7, wherein a material of the reflective layer comprises at least one of gold, silver, titanium and chromium.

11. The manufacturing method of the radio frequency transmission circuit board of claim 7, wherein after performing vacuum sputtering on the first dielectric layer, the blind hole is further enlarged to make the lens be partially exposed in the blind hole.

12. The manufacturing method of the radio frequency transmission circuit board of claim 7, wherein the portion of the first multilayer structure embedded with the optical fiber is not covered by the first bonding layer.

13. The manufacturing method of the radio frequency transmission circuit board of claim 7, wherein a distance between the active component and the chip is 2 mm to 10 mm.

14. The manufacturing method of the radio frequency transmission circuit board of claim 7, wherein a material of the first dielectric layer comprises at least one of modified polyimide, liquid crystal polymer and polytetraethylene.

15. The manufacturing method of the radio frequency transmission circuit board of claim 7, wherein a material of the second dielectric layer comprises at least one of modified polyimide, liquid crystal polymer and polytetraethylene.

16. The manufacturing method of the radio frequency transmission circuit board of claim 7, wherein a material of the third dielectric layer comprises at least one of modified polyimide, liquid crystal polymer and polytetraethylene.

17. The manufacturing method of the radio frequency transmission circuit board of claim 7, wherein a pressure is $8.0\times10^{-3}$ Pa to $8.2\times10^{-3}$ Pa during vacuum sputtering.

18. The manufacturing method of the radio frequency transmission circuit board of claim 7, wherein a current is 100 mA to 130 mA during vacuum sputtering.

19. The manufacturing method of the radio frequency transmission circuit board of claim 7, wherein a sputtering time is 180 seconds to 240 seconds during vacuum sputtering.

* * * * *